Figure 1:
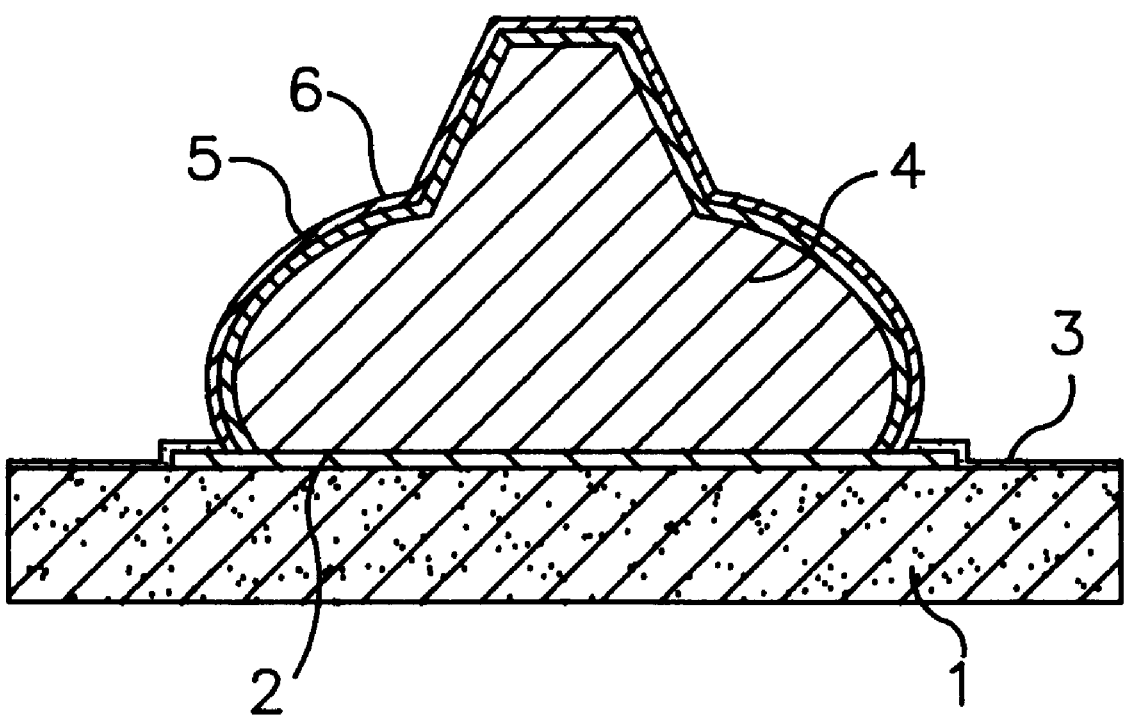

United States Patent

Zakel et al.

[11] Patent Number: 5,906,312
[45] Date of Patent: May 25, 1999

[54] SOLDER BUMP FOR FLIP CHIP ASSEMBLY AND METHOD OF ITS FABRICATION

[75] Inventors: Elke Zakel; Rolf Aschenbrenner, both of Berlin, Germany

[73] Assignee: Franunhofer-Gesellschaft zur Foerde-rung der angwandten Forschung e.V., Munich, Germany

[21] Appl. No.: 08/849,035

[22] PCT Filed: Nov. 10, 1995

[86] PCT No.: PCT/DE95/01590

§ 371 Date: Jul. 2, 1997

§ 102(e) Date: Jul. 2, 1997

[87] PCT Pub. No.: WO96/17382

PCT Pub. Date: Jun. 6, 1996

[30] Foreign Application Priority Data

Dec. 2, 1994 [DE] Germany .............................. 44 42 960

[51] Int. Cl.$^6$ .................................................. H01L 23/485
[52] U.S. Cl. .......................... 228/246; 228/254; 228/208; 257/738; 257/781; 438/617; 438/627
[58] Field of Search ..................................... 228/246, 254, 228/180.5, 208, 209; 29/874; 257/778, 780, 781, 738; 438/613, 617, 627, 628

[56] References Cited

U.S. PATENT DOCUMENTS

| 5,028,454 | 7/1991 | Lytle et al. | 427/123 |
| 5,633,204 | 5/1997 | Tago et al. | 438/614 |
| 5,683,942 | 11/1997 | Kata et al. | 438/118 |

*Primary Examiner*—Samuel M. Heinrich
*Attorney, Agent, or Firm*—Karl Hormann

[57] ABSTRACT

The invention relates to a solder bump for flip-chip assembly and consisting of a core containing a high proportion of a soft and electrically well conducting metal, particularly gold, and a diffusion barrier layer deposited on the solder bump core. As is known, the diffusion barrier layer functions to prevent intermetallic compounds between the gold of the solder bump core and the solder material, especially tin-lead solder material, which would otherwise reduce the mechanical stability of the solder connection. A pre-treatment with a cleaning solvent or in a nucleation bath has hitherto been necessary. to provide a good bond between the diffusion barrier layer, usually nickel, and the solder bump core. With the invention, this pretreatment process step is no longer necessary, since small amounts of a material are added to the solder bump core which acts as a nucleation material for the diffusion barrier layer. Such solder bump cores may, for instance, very easily and cost-efficiently be fabricated mechanically as ball bumps (with 98% of gold and 2% of palladium).

14 Claims, 1 Drawing Sheet

SOLDER BUMP FOR FLIP CHIP ASSEMBLY AND METHOD OF ITS FABRICATION

TECHNICAL FIELD

In flip-chip technology semiconductor chips are directly connected to substrates by means of solder bumps and for that reason require small mounting space only. Bumps currently used in flip-chip technology are solder bumps of homogeneous alloy materials, e.g. Pb/Sn 95/5 or eutectic compositions. The deposition of the bump metallization is carried out, for instance, by galvanic precipitation processes or by vapor deposition techniques. However, on a worldwide basis bumped chips or wafers with lead-tin solder materials are currently available from manufacturers in limited quantities only, so that gold bumps which for a long time already have been tested in TAB technology (tape automated bonding) and which have found application in a wide field, are a cost-efficient alternative. The invention is important to those fields of application in which substrate and/or contact pad materials allow using soft metal bumps which are good electrical conductors, in particular gold bumps, and corresponding solder materials, for fabricating connections, particularly flip-chip connections.

STATE OF THE ART

Gold bumps, in particular those made galvanically, are often used together with tin-containing solder materials for fabricating connections. This may lead to problems because of intermetallic phases which are formed extremely quickly with this type of paired materials. The strong reaction of the solder material, i.e. of the tin within the solder material, with the gold leads to intermetallic compounds such as AuSn, $AuSn_2$ and $AuSn_4$ which are brittle and adversely affect the mechanical stability as well as the electrical and thermal conductivity of the solder spots or connections. Even pores may be formed because of different diffusion coefficients (so-called Kirkendale effect) which are damaging to the reliability of the connection.

It is known from German Patent specification DE 2,032,872, that this problem may be avoided by a solderable protective layer or diffusion barrier layer or diffusion blocking layer of nickel on the gold bumps. For at a soldering temperature of about 350° C., nickel neither diffuses into gold nor is it dissolved in any noticeable manner in the lead-tin solder material, and thus it acts as a solderable layer protecting the gold from attacks by the solder material. In accordance with the mentioned patent specification, galvanic gold bumps are initially cleaned in acetone. Thereafter a layer of nickel is deposited on the gold bumps by a current-free deposition process. This selective nickel deposition on the gold bumps makes additional expensive masks of the kind required, for instance, in vapor deposition processes superfluous. In addition to the layer of nickel, a soft solderable layer may for special purposes be applied by a dip process. For this purpose, tin or tin alloy or lead solder layers have proven to be advantageous. Whereas thermo-compression or ultrasonic connection techniques only may be used for gold bumps without nickel layers, gold bumps provided with a layer of nickel may also be used in flip-chip bonding. In the known process, the cleaning step of the galvanic gold bumps required for a good bonding base prior to nickel deposition is disadvantageous. This cleaning step slows down the manufacture of the diffusion barrier layer on the gold bumps and reduces the maximum production capacity.

DESCRIPTION OF THE INVENTION

Proceeding from the state of the art described supra, it is a task of the invention to provide a solder bump with particularly good bonding characteristics as well as a method of its fabrication which may be practiced easily, quickly and cost-efficiently.

A solution in accordance with this task consists of a solder bump in accordance with the characterizing elements of claim 1 and of a method of its fabrication according to claim 8. Preferred improvements are described in the subclaims.

A solder bump in accordance with the invention consists of a core on which at least one layer has been applied. The solder bump core contains a high proportion of a metal which is soft and a good electrical conductor and which also allows the fabrication of very small solder bumps. In addition, a small proportion of a nucleation material for ensuring a good bond of a diffusion barrier layer on a solder bump core is contained in a solder bump core. More particularly, a solder bump in accordance with the invention consists of a core of a high proportion of gold on which a layer is deposited which acts as a diffusion barrier layer between the gold in the core material of the solder bump and the solder material which comes into contact with the solder bump in accordance with the invention. It is essential that the core material of a solder bump in accordance with the invention not consist or 100% gold, as is the case in known galvanic gold bumps, but that it additionally contain a small proportion of a material which acts as a nucleation material for the diffusion barrier layer material subsequently to be deposited on the core material of a solder bump. This nucleation material contained in the core material brings about a good and reliably bond of the diffusion barrier layer on the core material of a solder bump in accordance with the invention. For this reason, the otherwise required pretreatment for obtaining a good bonding basis, be it by a cleaning solvent or by a nucleation bath, may be dispensed with in the fabrication process of this diffusion barrier layer. In the method in accordance with the invention the steps of pre-treating a solder bump core are no longer required, which means a significant saving of time and, hence, results in a higher production rate.

The first step of the method in accordance with the invention consists of fabricating one or more solder bump cores on a support material, e.g. a wafer or semiconductor chip. Thereafter, a diffusion barrier layer is directly deposited on these cores without any pretreatment. Advantageously, this is carried out by a current-free auto-catalytic process, whereby the diffusion barrier layer is deposited only on the solder bump cores and not on the passivation layers in the areas between the solder bumps. The layer thickness of the diffusion barrier layer can be set in a very simple manner by the length of period in the catalytic bath and may be made sufficiently thick to prevent any diffusion of gold or solder material, in particular tin, through this layer. The material of the diffusion barrier layer should neither diffuse into the solder bump core nor should it be dissolved by the solder material subsequently contacting the solder bump during the soldering operation.

In an advantageous improvement of the invention, following a cleansing or rinsing operation, a further layer is deposited on the diffusion barrier layer. The further layer protects the diffusion barrier layer from oxidation and makes possible a good wetting of the solder material. To this end, a thin layer of gold is preferably deposited, which is best accomplished by dipping into a immersion gold bath. This outer gold protection layer is so thin and its absolute gold contents is so negligible that the formation of any intermetallic phases of this gold with the solder material do not adversely affect the mechanical stability of the solder connection. Since the method in accordance with the invention renders any pre-treatment of the solder bump core superfluous it may be executed in an especially simple and quick manner making it eminently suited for use on an industrial scale.

A solder bump core is preferably fabricated as a so-called ball bump. For this purpose, a conventional wire bonding apparatus is utilized, the applied software and the support device for the bonding wire being slightly modified in accordance with the requirements of the ball bump fabrication. To form a ball bump, the bonding wire is pressed onto a contact pad, resulting, together with the heat thus generated and the applied ultrasound (e.g. therm-sonic bonding), in a connection with the pad. The geometric dimensions of the ball bump may be set by the chosen bonding parameters pressure (of the wire on the pad) and. more particularly, the diameter of the bonding wire. The wire is severed by a scorching device of the wire bonding apparatus, and the height of the ball bump is determined in this manner. To achieve greater bump heights, a plurality, typically two to three, of such bumps are often stacked upon each other.

In an advantageous embodiment of the invention the diffusion barrier layer is made of nickel and/or palladium. In such cases, palladium is utilized as a nucleation material. For that reason, commercially available wire material with a high proportion of gold and a small residual proportion of palladium may be used for fabricating the mechanical ball bumps in a cost-efficient manner. In contrast to bumps fabricated galvanically or by vapor deposition processes, mechanical ball bumps may be made with comparatively little effort and, thus, cost-efficiently, particularly on single chips, e.g. in the context of prototype fabrication. Their need for small space, also in their fabrication, is an advantage which makes their use possible in fields of application in which known galvanic gold bumps are either not useable at all or on a very limited scale only. Among these, in particular, is the area of miniature components of the kind use in microsurgery.

Moreover, the mechanical deformability, vertically as well as horizontally, of a ball bump may be set in wide ranges by a controlled setting of its geometric dimensions. A small geometric deformability in a hoizonal direction makes it possible to fabricate closely spaced ball bumps without having to worry about short circuits. High deformability in a vertical direction is a prerequisite for evening out slightly different heights of gold ball bumps, for instance, on a semiconductor chip during the soldering operation, thereby providing planarity of the components connected with the bumps.

The diffusion barrier layer deposited on the solder bump core prevents diffusion of the gold of the solder bump core to the solder material contacting the solder bump in accordance with the invention, and vice versa. The electrical and thermal conductivity of such a diffusion barrier layer is high, and the contact resistances to adjacent layers, particularly to the solder bump core, are low. In addition, mechanical properties such as good bonding strength and resistance to mechanical and thermal stress are satisfied extremely well by the solder bump in accordance with the invention.

The method in accordance with the invention leads to a bump metallization which makes different connection techniques possible. Soldering processes in flip-chip technology in which solder is deposited on a substrate or in which solder, by dipping in liquid solder material, remains attached on the bump in accordance with the invention by adhesive forces, are particularly well suited connection techniques.

It is possible to have the solder bump cores of solder bumps in accordance with the invention deposited, for instance, on individual semiconductor chips or on whole wafers by specialized bumping companies. In such cases, the other steps of the method in accordance with the invention for the final formation of solder bumps in accordance with the invention are then to be executed by individual users in accordance with a given application.

The invention yields the advantages hereinafter described.

Gold ball bumps are a cost-efficient alternative to galvanically fabricated gold bumps. Because of the invention, this type of bump metallization may be applied for the first time in connection with flip-chip assembly with solder material, and more particularly lead/tin solder material. The low proportion of a nucleation material in a gold ball bump yields the additional advantage that the pre-treatment in galvanically fabricated gold bumps for obtaining a good bonding basis for a diffusion barrier layer may be dispensed with. Accordingly, the method in accordance with the invention may be practiced with at least one less process step.

One advantage of the simple and cheap process technique of the method in accordance with the invention becomes particularly apparent in connection with wafers having hundreds of bumps thereon. In this manner high volume production in industrial manufacturing may be achieved.

The invention will hereinafter be described on the basis of an embodiment with reference to the drawing.

The only figure depicts a section of a silicon chip with a mechanically fabricated gold ball bump on which a diffusion barrier layer of nickel and a gold contact metallization have been deposited. In the embodiment, gold bumps 4 are formed on aluminum pads 2 of a silicon chip 1. For protection, the areas outside of the aluminum pads are provided with electrically non-conductive passivation layers 3. Wire material containing 98% of gold and 2% of palladium is used for fabricating the ball bumps with conventional wire bonders. For reasons of simplicity, only a section of the silicon chip with a single ball bump is shown in the drawing. In a second process step a layer 5 of nickel is provided on the gold ball bumps of the silicon chips in a nickel bath by means of autocatalytic nickel precipitation. Commercial baths have proven to be suitable. At a growth rate of the nickel layer of 25 $\mu$m per hour, a nickel layer of 3 $\mu$m thickness is precipitated after a dwell time of about 8 min. Following the formation of the nickel layer deposited rinsing is performed in a water bath.

Thereafter, the nickel plated gold ball bumps on the silicon chip are dipped into an immersion gold bath. The formation of a gold layer on a bump takes place until a continuous layer of gold has been formed and the ion exchange with the nickel layer has been terminated. The formed immersion gold layer reaches a maximum thickness of about 0.2 $\mu$m. This gold contact metallization offers the advantage that it yields a good wetting of the solder material and that it also protects the nickel from oxidizing.

We claim:

1. A solder bump consisting of a solder bump core with one or more layers deposited thereon, the solder bump core containing a high proportion of a soft and electrically well conducting first material and a first layer deposited on the solder bump core as a diffusion barrier layer between the first metal in the solder bump core and the solder material contacting the solder bump, characterized by the fact that the solder bump core contains a small proportion of a nucleation material for the diffusion barrier layer.

2. The solder bump of claim 1, characterized by the fact that the noble metal gold is used as the first material contained in a high proportion in the solder bump core.

3. The solder bump of claim 1, characterized by the fact that a contact metallization is deposited on the diffusion barrier layer for protecting the diffusion barrier layer from oxidation and/or providing good wetting of the solder material.

4. The solder bump of claim 3, characterized by the fact that the contact metallization consists of gold, more particularly of immersion gold.

5. The solder bump of claim 1, characterized by the fact That the nucleation material is palladium and that the solder bump core consists of 98% gold and 2% palladium.

6. The solder bump of claim 1, characterized by the fact that the diffusion barrier layer consists of nickel and/or palladium.

7. The solder bump of claim 1, characterized by the fact that the solder bump core is structured as a mechanically fabricated ball bump.

8. A method of making the solder bump of claim 1, characterized by the following method steps:

fabricating a solder bump core, depositing a diffusion barrier layer, the metal for forming the diffusion barrier layer being deposited directly on the solder bump core without any pre-treatment.

9. The method of claim 8, characterized by the fact that the solder bump core is fabricated mechanically as a ball bump.

10. The method of claims 8, characterized by the fact that the solder bump core is fabricated of a material having a high proportion of gold and a residual proportion of palladium, in particular 98% of gold and 2% of palladium.

11. The method of one of claims 8, characterized by the fact that the diffusion barrier layer is deposited on the solder bump core by a current-free process.

12. The method of claims 8, characterized by the fact that in a further method step a contact metallization is deposited on the diffusion barrier layer, in particular by a current-free process.

13. The method of claim 12, characterized by the fact that gold, more particular immersion gold, is used for the contact metallization.

14. The method of claims 8, characterized by the fact that nickel and/or palladium is used as the metal for the diffusion barrier layer.

* * * * *